(12) United States Patent
Zerbe et al.

(10) Patent No.: US 7,298,807 B2
(45) Date of Patent: Nov. 20, 2007

(54) CIRCUIT, APPARATUS AND METHOD FOR ADJUSTING A DUTY-CYCLE OF A CLOCK SIGNAL IN RESPONSE TO INCOMING SERIAL DATA

(75) Inventors: Jared Zerbe, Woodside, CA (US);
Mark Horowitz, Menlo Park, CA (US);
Carl Werner, Los Gatos, CA (US)

(73) Assignee: Rambus Inc., Los Altos, CA (US)

( * ) Notice: Subject to any disclaimer, the term of this patent is extended or adjusted under 35 U.S.C. 154(b) by 659 days.

(21) Appl. No.: 10/672,853

(22) Filed: Sep. 26, 2003

(65) Prior Publication Data

US 2004/0161068 A1  Aug. 19, 2004

Related U.S. Application Data

(60) Provisional application No. 60/446,491, filed on Feb. 11, 2003.

(51) Int. Cl.
*H04L 7/00* (2006.01)
(52) U.S. Cl. .................................................. 375/355
(58) Field of Classification Search ................ 375/355, 375/359, 360, 375, 376; 713/400–601
See application file for complete search history.

(56) References Cited

U.S. PATENT DOCUMENTS

| | | | |
|---|---|---|---|
| 5,742,798 A | | 4/1998 | Goldrian |
| 6,525,520 B2* | | 2/2003 | Davidsson et al. ...... 324/76.54 |
| 6,886,106 B2* | | 4/2005 | Brock et al. ................ 713/500 |
| 2005/0206419 A1* | | 9/2005 | Kizer et al. ................. 327/158 |

FOREIGN PATENT DOCUMENTS

JP  02000035831 A  2/2000

* cited by examiner

*Primary Examiner*—Don N. Vo
(74) *Attorney, Agent, or Firm*—Vierra Magen Marcus & DeNiro LLP

(57) ABSTRACT

A circuit, apparatus and method for maximizing system margins by adjusting a duty-cycle of a clock signal in a receive circuit to whatever duty-cycle is optimal for the particular incoming serial data, rather than the typical 50% duty-cycle, is provided in embodiments of the present invention. A receive circuit, including duty-cycle-correction logic, is included in a double-data rate communication apparatus having a transmit circuit transmitting serial data having duty-cycle distortion. A receive circuit includes a first and second sampler to obtain data and edge values of an incoming serial data responsive to a data and edge clock, respectively. A duty-cycle-correction logic generates a duty-cycle-correction signal to a duty-cycle clock integrator that adjusts the edge clock signals while maintaining quadrature to the data clocks. In an embodiment of the present invention, a duty-cycle-correction logic includes an evaluator circuit to generate an up or down signal responsive to the data and/or edge values. In a further embodiment of the present invention, an evaluator circuit is coupled to a counter and a DAC to generate a duty-cycle-correction signal to the duty-cycle clock integrator. A digital filter or coding scheme is also used to reduce the likelihood of misinterpreting malevolent incoming serial data for duty-cycle distortion in an embodiment of the present invention.

27 Claims, 9 Drawing Sheets

CIRCUIT, APPARATUS AND METHOD FOR ADJUSTING A DUTY-CYCLE OF A CLOCK SIGNAL IN RESPONSE TO INCOMING SERIAL DATA

PRIORITY CLAIM

The present application claims priority to U.S. Provisional Patent Application Ser. No. 60/446,491, entitled, "A CIRCUIT, APPARATUS AND METHOD FOR ADJUSTING A DUTY-CYCLE OF A CLOCK SIGNAL IN RESPONSE TO INCOMING SERIAL DATA", which application was filed on Feb. 11, 2003.

FIELD OF THE INVENTION

The present invention relates to communication systems, and in particular, double-data rate communication systems.

BACKGROUND OF THE RELATED ART

A double-data rate ("DDR") system includes a transmit circuit for transmitting serial data, having a particular duty-cycle, to a receiving circuit. Most receive circuits include a clock circuit for synchronizing the incoming serial data. In particular, the sampling clocks are recovered by looking at the incoming data stream and aligning sampling edges to the center of the data eyes or data cells. Ideally, the incoming serial data has a 50% duty-cycle.

However, a receive circuit may receive incoming data that has duty-cycle distortion and does not have the ideal 50% duty-cycle. First, a transmit clock circuit may generate a clock signal used for transmitting the data that does not have the ideal 50% duty-cycle. The transmit clock circuit may include Complementary Metal Oxide Semiconductor ("CMOS") transistors that may be prone to random variations that introduce errors in the transmit clock signal. Second, a receive circuit introduces errors. For example, the receive circuit observes or reacts to rising edges faster than falling edges of a received data signal. Once again, this may cause a receiver recovered clock that is not centered at a data eye. Third, channel effects may cause duty-cycle distortion. For example, the medium used in transferring the serial data between the transmit circuit and receive circuit introduces delays that skew the expected data eye. Fourth, the receive clock itself may have a duty-cycle distortion present in it which may cause the input data to appear distorted when sampled by the receive clock.

Therefore, it is desirable to provide a circuit, apparatus and method for reducing the errors in obtaining data values caused by duty-cycle distortion.

DETAILED DESCRIPTION

A circuit, apparatus and method for maximizing system margins by adjusting a duty-cycle of a clock signal in a receive circuit to whatever duty-cycle is optimal for the particular incoming serial data, rather than the typical 50% duty-cycle, in an embodiment of the present invention. A receive circuit, including duty-cycle-correction logic, is included in a double-data rate communication apparatus having a transmit circuit transmitting serial data having duty-cycle distortion. A receive circuit includes a first and second sampler to obtain data and edge values of an incoming serial data responsive to a data and edge clock, respectively. A duty-cycle-correction logic generates a duty-cycle-correction signal to a duty-cycle clock integrator that adjusts the clock signal including the edge clocks while maintaining the same relative phase position to the data clocks. In an embodiment of the present invention, a duty-cycle-correction logic includes an evaluator circuit to generate an up or down signal responsive to the data and/or edge values. In a further embodiment of the present invention, an evaluator circuit is coupled to a counter and a digital-to-analog converter ("DAC") to generate a duty-cycle-correction signal to the duty-cycle clock integrator. A digital evaluator on the input of the integrator or digital counter or a coding scheme is also used to reduce the likelihood of misinterpreting malevolent incoming serial data as duty-cycle distortion in an embodiment of the present invention.

Figure 1:
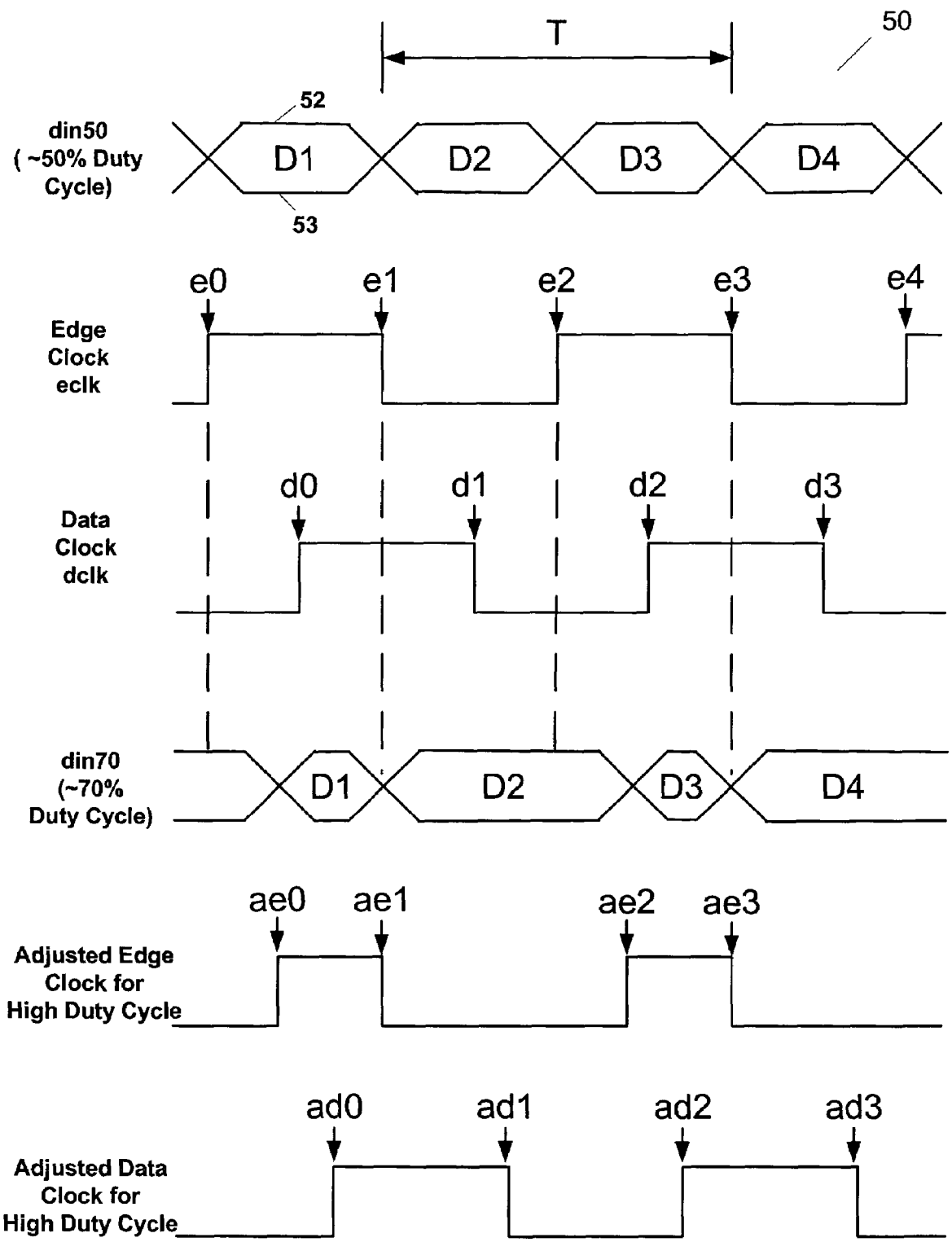
FIG. 1 is a diagram illustrating signals that may be used in accordance with an embodiment of the present invention.

In an over sampled, DDR clock recovery circuit, two adjacent data symbols are sampled with a rising and a falling edge of the same clock. The accuracy of the clock duty cycle in a DDR system is critical as it impacts the final symbol size and thus the worst-case timing margins. In a DDR clock recovery circuit as shown in FIG. 1 sampled data feedback is used to keep sampling edges d0 and d1 centered in the data cells D1 and D2, respectively, as seen in FIG. 1. Edge sampling clocks e0 and e1 are generated at "quadrature" or 90 degree phase offsets to data clock edges d0 and d1 respectively. Phase comparator logic that provides this feedback over-samples the incoming received signal to determine if the recovered clock is early or late with respect to the ideal sampling point of data eyes D1 and D2 and then advances or delays the sampling clock in response to the early or late data. The logic will determine that the sampling clock is late (compared to ideal) if edge and data samplers clocked by e0 and d0 consistently receive the same data. Similarly, the sampling clock is said to be early if edge and data samplers clocked by d0 and e1 are consistently the same. In a system that has ideal duty cycle, and is perfectly locked, the edge samplers clocked by e0 and e1 will produce data that is uncorrelated to the data samplers clocked by d0 and d1. This condition represents the condition where the edge clocks are perfectly positioned in the noisy transition region of data eyes D1 and D2. Phase mixers receiving fixed reference clock data from a phase-locked-loop (PLL) or other clock source advance or delay the reference clock signal in response to the early and late indications. An exemplary logic for an over-sampled CDR and phase mixing is described in Chih-Kong Ken Yang; Ramin Farjad-Rad; Horowitz, M. A., "A 0.5-μm CMOS 4.0-Gbit/s serial link transceiver with data recovery using oversampling," IEEE Journal of Solid State Circuits, Volume 33, Issue 5, May 1998, pp. 713-722 which is incorporated by reference herein.

In an embodiment of the present invention, early and late data may be accumulated over some number of clock cycles. In this embodiment an additional logic circuit, a majority voter, can be used to produce a single early or late output only if a majority of the accumulated edge and data sample pairs were early or late. In an embodiment of the present invention, two to ten votes could be counted. This voting creates an averaging effect which may be desirable to prevent spurious adjustment of the recovered clock and filtering the received timing information. In DDR systems that use multi-level signaling or N-PAM signaling a similar method of clock recovery may be used in an embodiment of the present invention. An exemplary method is described in Farjad-Rad, R.; Yang, C. -K. K.; Horowitz, M. A.; Lee, T. H., "A 0.4-μm CMOS 10-Gb/s 4-PAM pre-emphasis serial link transmitter," IEEE Journal of Solid-State Circuits, Volume 34, Issue 5, May 1999, pp. 580-585 which is incorporated by reference herein.

FIG. 1 illustrates serial data and clock signals 50 in accordance with an embodiment of the present invention. Serial data din50 represents the alternating transitions of serial data that may be transported on a medium to a receive circuit. Serial data din50 is shown having an ideal duty-cycle of 50%. Duty-cycle is defined as the amount of time a signal is at a predetermined phase value (for example, a high value) divided by the period of the signal T (or cycle). Data cell or data eye D1 represents a period of time in serial data din50 in which a data value may have a high value 52 or low value 53. Edge clock eclk is used to determine the boundary of data cell D1, as well as data cells D2, D3 and D4, or the transition from high to low or from low to high. For example, the rising edge e0 and falling edge e1 of edge clock eclk are used to define data cell D1.

Data clock signal dclk is 90° offset or out of phase from edge clock eclk and is used to sample the value of the actual data cell. For example, the data clock dclk rising edge d0 is used to determine the time at which the value of serial data din50 is sampled, in particular, the time at which to sample serial data din50 in order to determine the value of data cell D1. Data clock dclk and edge clock eclk are input into respective samplers whose outputs are also used to adjust the timing of the eclk and dclk edges with respect to din50. Data cell D1 may have a binary one value corresponding to high value 52 or a binary zero value corresponding to low value 53 in an embodiment of the present invention. Likewise, data clock dclk falling edge d1 is used to determine the sampling time associated with data cell D2.

FIG. 1 also illustrates incoming serial data din70 having a high duty-cycle, for example an approximate 70% duty-cycle, caused by duty-cycle distortion. As can be seen, edges e0 and e2 no longer define the data cells for a serial data din70 and should be adjusted to edges ae0 and ae2, respectively, in order to maximize margins and reduce error rates. Similarly, data clock dclk edges d0-d3 are no longer centered on the data cells D1-D4 when the incoming serial data has a high duty-cycle and data clock edges d0-d3 should be likewise adjusted to adjusted data edges ad0-ad3.

Similarly, data clock dclk and edge clock eclk should be adjusted to a more optimal placement of edges if the incoming signal has a low duty-cycle, or less than 50% duty-cycle.

As described below in various embodiments of the present invention, the duty cycle of a clock recovered from a received signal, and in particular a data clock dclk and edge clock eclk, is adjusted in response to the duty-cycle of the incoming serial data in order to reduce error rates. In an embodiment the edge clock is adjusted to best match the duty cycle of the incoming data stream whereas the data clock is kept as close to 50% as possible, but is kept at a 90 degree phase position to the adjusted edge clock. In alternate embodiments, the relative phase position of the edge and data clocks can be adjusted via an offset register in order to best position the data clocks within eyes which have inherent distortions present.

Figure 2:
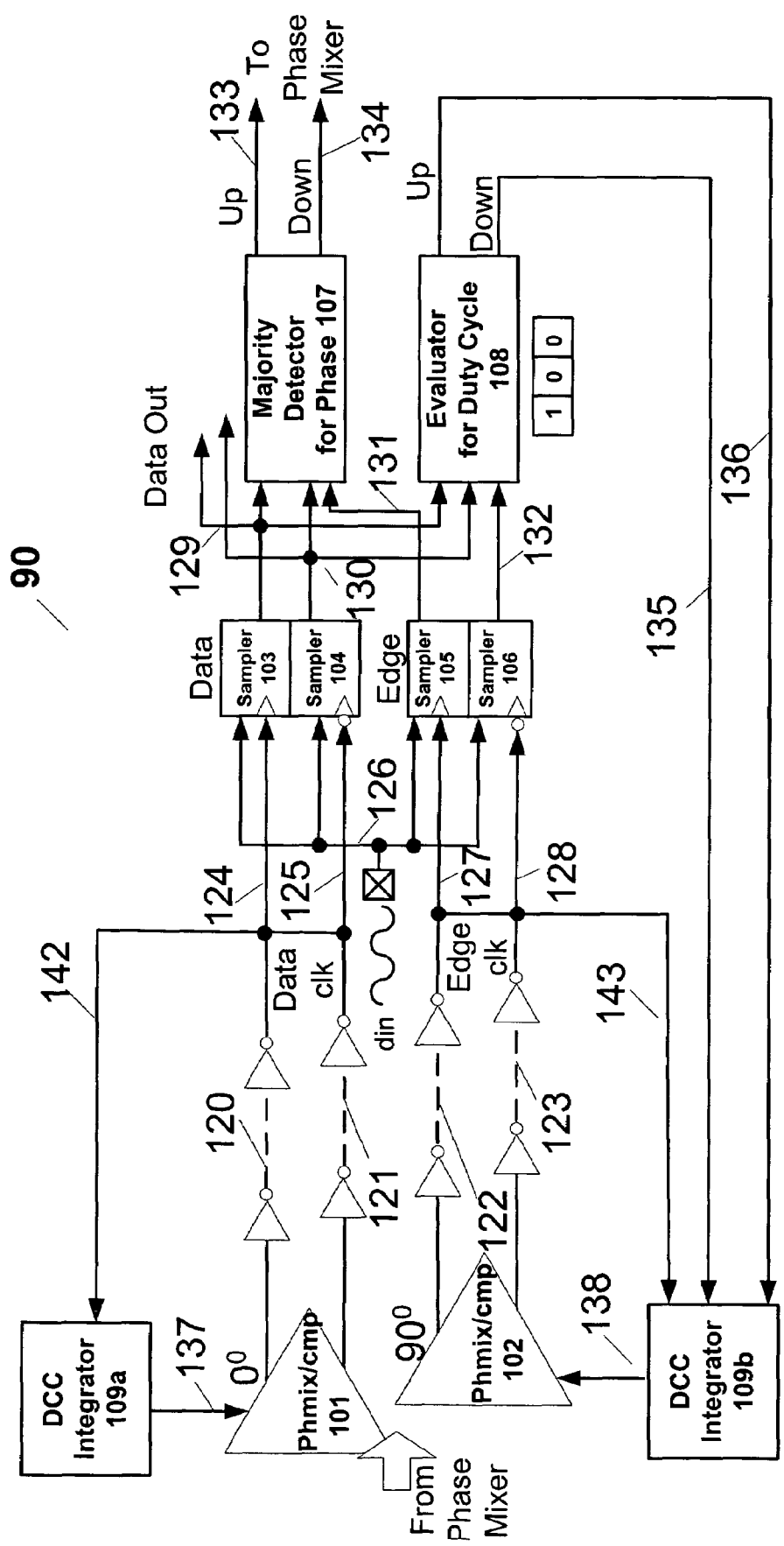
FIG. 2 is a block diagram illustrating obtaining edge and data values for adjusting a duty-cycle of a clock signal in accordance with an embodiment of the present invention.

FIG. 2 is a block diagram illustrating obtaining edge and data values for adjusting a duty-cycle of a clock signal in receive circuit 90 in accordance with an embodiment of the present invention. In this embodiment of the present invention, one of the edge samplers (for example, a rising edge sampler or falling edge sampler) outputs an edge value used to determine the phase of the incoming serial data and the other sampler outputs an edge value used to generate a duty-cycle-correction signal. Accordingly, a duty-cycle of a clock signal in receive circuit 90 is adjusted; and in particular, the duty-cycle of the edge clock eclk is adjusted to match the duty-cycle of the incoming serial data din on line 126 at the same time that the phase of the incoming clock is adjusted by the outputs of the majority detector for phase 107.

Serial data din having a particular duty-cycle is input to receive circuit 90 on line 126 coupled to the inputs of data samplers 103-104 and edge samplers 105-106. In an embodiment of the present invention, data sampler 103 samples serial data din in response to the rising edge of data clock dclk on line 124 (relative phase 0 degrees), and data sampler 104 samples serial data din in response to the falling edge of data clock dclk on line 125 (relative phase 180 degrees—i.e. complementary to the signal on line 124). Similarly, edge sampler 105 samples serial data din in response to the rising edge of edge clock eclk on line 127 (relative phase 90 degrees—i.e. in quadrature to the signal on line 124) and edge sampler 106 samples serial data din in response to the falling edge of edge clock eclk on line 128 (relative phase 270 degrees—i.e. complementary to 127 and in quadrature to the signal on line 125).

Data clock dclk is generated from phase mixer/comparator (Phmix/cmp) 101 and edge clock eclk is generated from phase mixer/comparator (Phmix/cmp) 102 responsive to an output from a phase mixer and duty-cycle-correction signals output from duty-cycle clock ("DCC") integrators 109a and 109b, respectively. A data clock dclk on line 142 (by way of lines 124 and 125) is fed back to DCC integrator 109a and an edge clock eclk on line 143 (by way of lines 127 and 128) is fed back to DCC integrator 109b.

Buffers 120-123 allow the clock drive signal strength to be increased to be able to drive the significant load of the samplers and any following stages of latches.

A first data value obtained using a rising edge data clock dclk and a second data value obtained using a falling edge data clock dclk are output from samplers 103 and 104 on lines 129 and 130, respectively, to majority detector for phase 107 and evaluator circuit for duty-cycle 108. A first edge value, obtained using a rising edge of edge clock eclk, is output on line 131 to majority detector for phase 107. A second edge value obtained using a falling edge of edge clock eclk is output on line 132 to evaluator circuit 108.

Majority detector for phase 107 generates up and down signals on lines 133 and 134 to a phase mixer, responsive to the inputted data values and an edge value in order to align the edge clocks to the transition regions and thus the data clocks in the center of the valid data region. Accordingly, phase adjustment is determined by using an output from a single edge sampler 105.

Evaluator circuit for duty-cycle 108 generates up and down signals on lines 136 and 135, respectively, to DCC integrator 109b in order to adjust a clock duty-cycle. In an embodiment of the present invention, evaluator circuit 108 generates an up signal or a down signal responsive to a first data value, a first edge value and a second data value. For example, if a first data value is a logical "1", an edge value is a logical "0" and a second data value is a logical "0", a determination is made that the edge of edge clock eclk arrived late and a down signal is generated in order to reduce a clock signal duty-cycle. Conversely, if a first data value is a logical "1", an edge value is a logical "1" and the second data value is a logical "0", a determination is made that the edge of the edge clock eclk arrived early and an up signal is generated to increase a clock signal duty-cycle. Signals on lines 135 & 136 are then combined with the actual feedback edge clock on line 143 in the DCC integrator 109b and used to generate an offset from 50% in the DCC integrator 109b output on line 138. Data clock signals are also feedback on line 142 and input to DCC integrator 109a and used to generate DCC output 137 without an offset, i.e. as close to 50% as possible.

Thus, in this embodiment, edge values from one of the edge samplers (either edge sampler 105 or 106) determine phase and the other determines duty-cycle for a clock signal.

Figure 3:
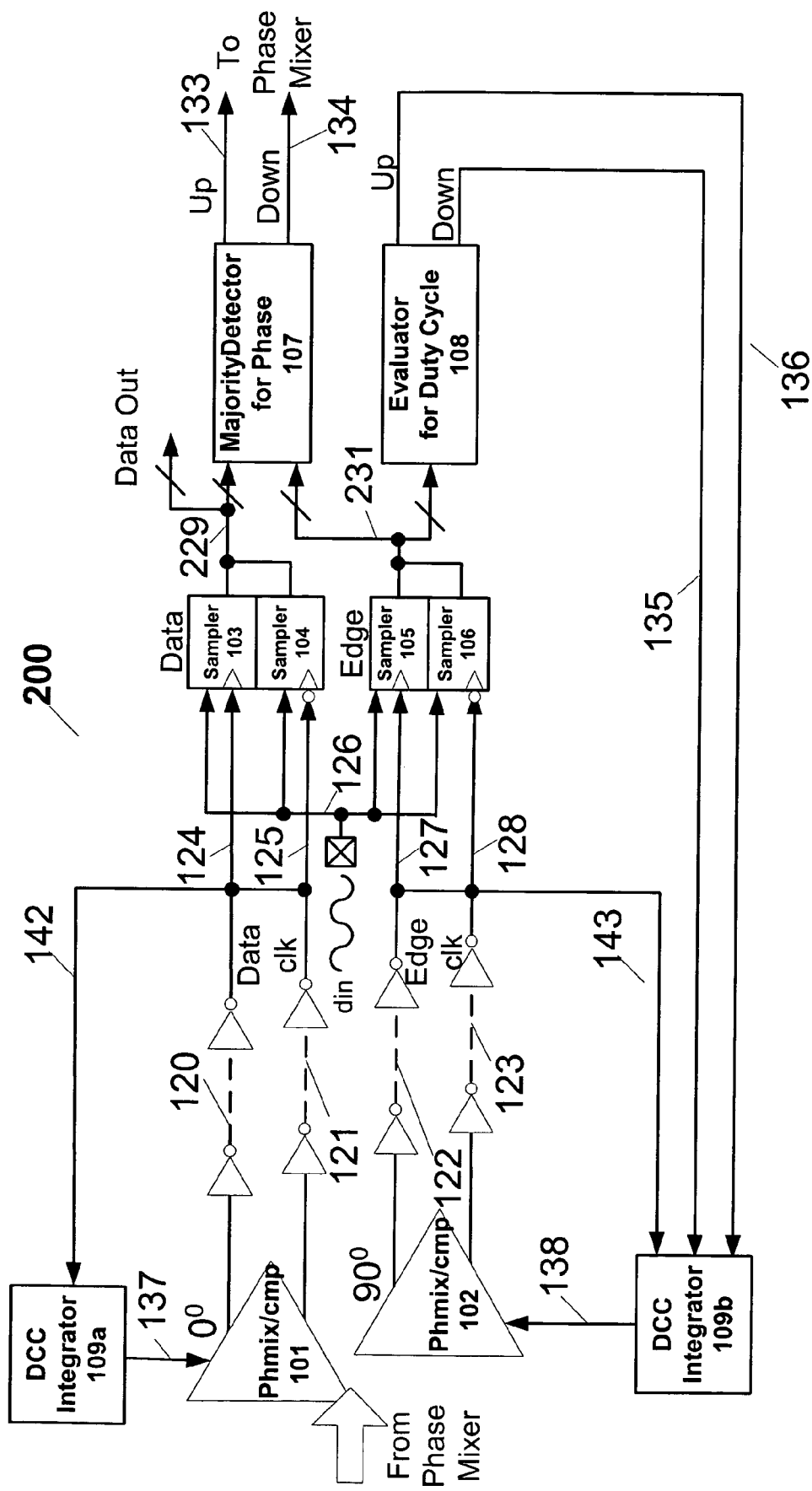
FIG. 3 is a block diagram illustrating obtaining edge values for adjusting a duty-cycle of a clock signal in accordance with an embodiment of the present invention.

FIG. 3 is a block diagram illustrating simultaneously acquiring phase and a duty-cycle of incoming serial data in receive circuit 200 in accordance with an embodiment of the present invention. FIG. 3 illustrates components having the same reference numbers as shown in FIG. 2 and described above.

Unlike FIG. 2, evaluator circuit 108 is coupled to both edge samplers 105 and 106 by line 231. Edge samplers 105 and 106 outputs are also coupled to majority detector 107 by line 231. Data samplers 103 and 104 outputs are coupled to majority detector 107 by line 229.

Evaluator circuit for duty-cycle 108 generates up and down signals on lines 136 and 135, respectively, to DCC integrator 109b in order to adjust a clock duty-cycle responsive to edge values. For example, if a first edge value e0 is a logical "1", a second edge value e1 is a logical "0", a third edge value e2 is a logical "1" and a fourth edge value e3 is a logical "0", a determination is made that a duty-cycle of the incoming data is high and a down signal is generated in order to reduce a clock signal duty-cycle. Conversely, if a first edge value e0 is a logical "0", a second edge value e1 is a logical "1", a third edge value e2 is a logical "0" and a fourth edge value e3 is a logical "1", a determination is made that a duty-cycle of the incoming data is low and an up signal is generated in order to increase a clock signal duty-cycle.

The embodiment described above and illustrated in FIG. 3 provides advantages over the other embodiments. The receive circuit 200 has better transition density and tracking compared to the embodiment illustrated in FIG. 2 and thus provides better edge placement and lower jitter. The present embodiment may, however, incorrectly interpret a malevolent data pattern or signal in incoming serial data din caused by inter-symbol interference ("ISI") as duty-cycle distortion.

Figure 6:
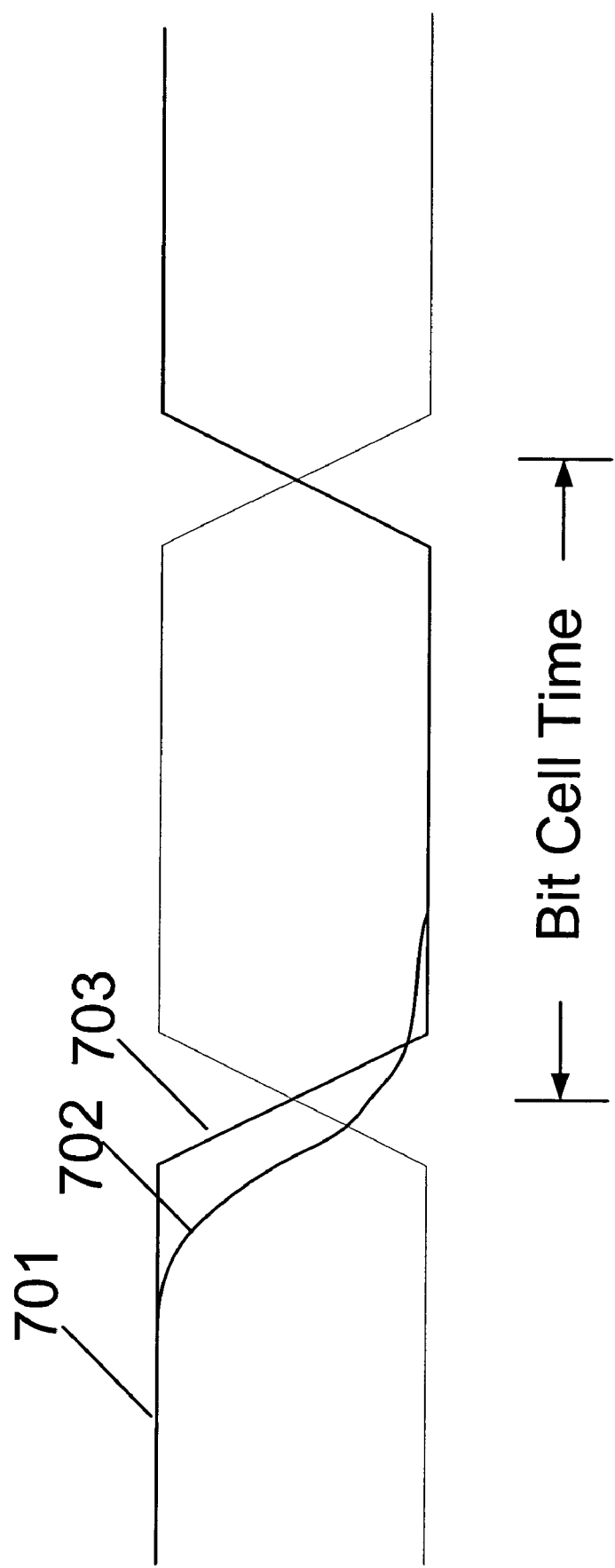
FIG. 6 is a waveform illustrating a malevolent data pattern in accordance with an embodiment of the present invention.

For example, FIG. 6 illustrates a malevolent data signal. An ideal data signal 701 having a bit cell time is shown in comparison to a malevolent data signal 702. The malevolent signal 702 has a single falling edge occurring before the ideal falling edge 703. Thus, a data signal with a single early falling edge appears as a data eye that was generated with a duty-cycle larger than 50% or duty-cycle distortion. If such a pattern is repeated with no transitions on the alternate clock edge the offset due to ISI can be misinterpreted as duty-cycle error. The fact that there are only transitions on one clock edge makes it difficult for the circuit to determine if there is in fact a duty-cycle error or if all edges suffer from ISI.

Figure 4:
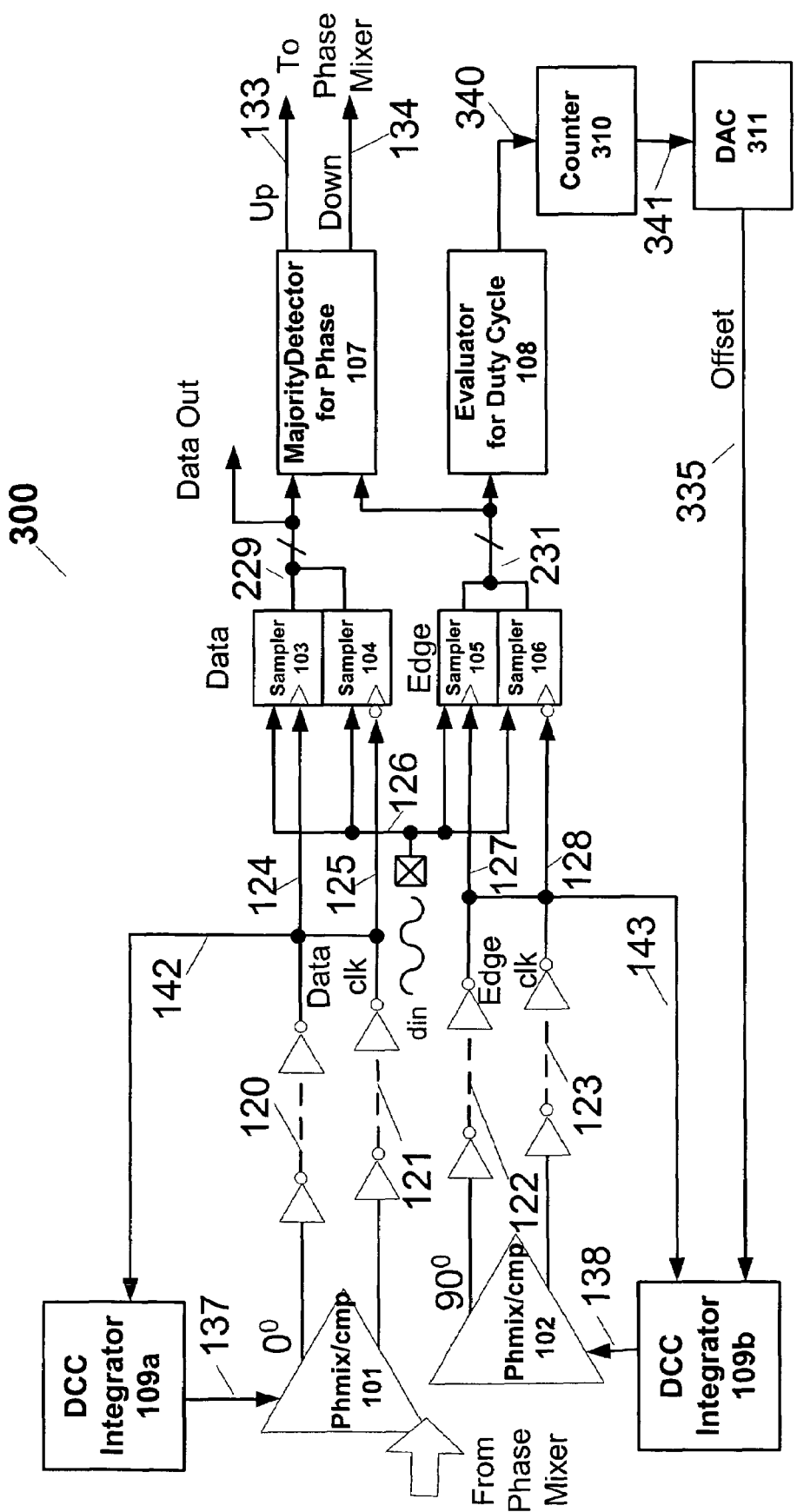
FIG. 4 is a block diagram illustrating using an offset signal in adjusting a duty-cycle of a clock signal in accordance with an embodiment of the present invention.

In one embodiment of the present invention as shown in FIG. 4 the duty cycle evaluator 108 is coupled to a counter 310 and a DAC 311. This embodiment provides several advantages over the other embodiments provided herein. First, receive circuit 300 has relatively simple loop dynamics compared to the other embodiments. Second, if desired, one of the DCC integrators, 109b can be eliminated and the phase mixer/comparator 102 driven directly by the DAC 311. This can reduce circuit complexity, cost and size. Note that this embodiment eliminates the direct feedback loop 143 and maintains a full digital state for duty-cycle correction. Counter 310 and DAC 311 are used to eliminate DCC integrators in other embodiments of the present invention. Additionally, an embodiment shown in FIG. 4 provides reduced transition density and improved phase acquisition as both edge samplers are used simultaneously for phase and duty-cycle adjustment.

FIG. 4 shows similar components seen in FIG. 3. However, evaluator circuit 108 generates an adjust signal on line 340 to a counter 310 that provides a count value on line 341. An input of DAC 311 is coupled to line 341 and outputs an analog offset signal on line 335 to an offset port of DCC integrator 109b.

Figure 5:
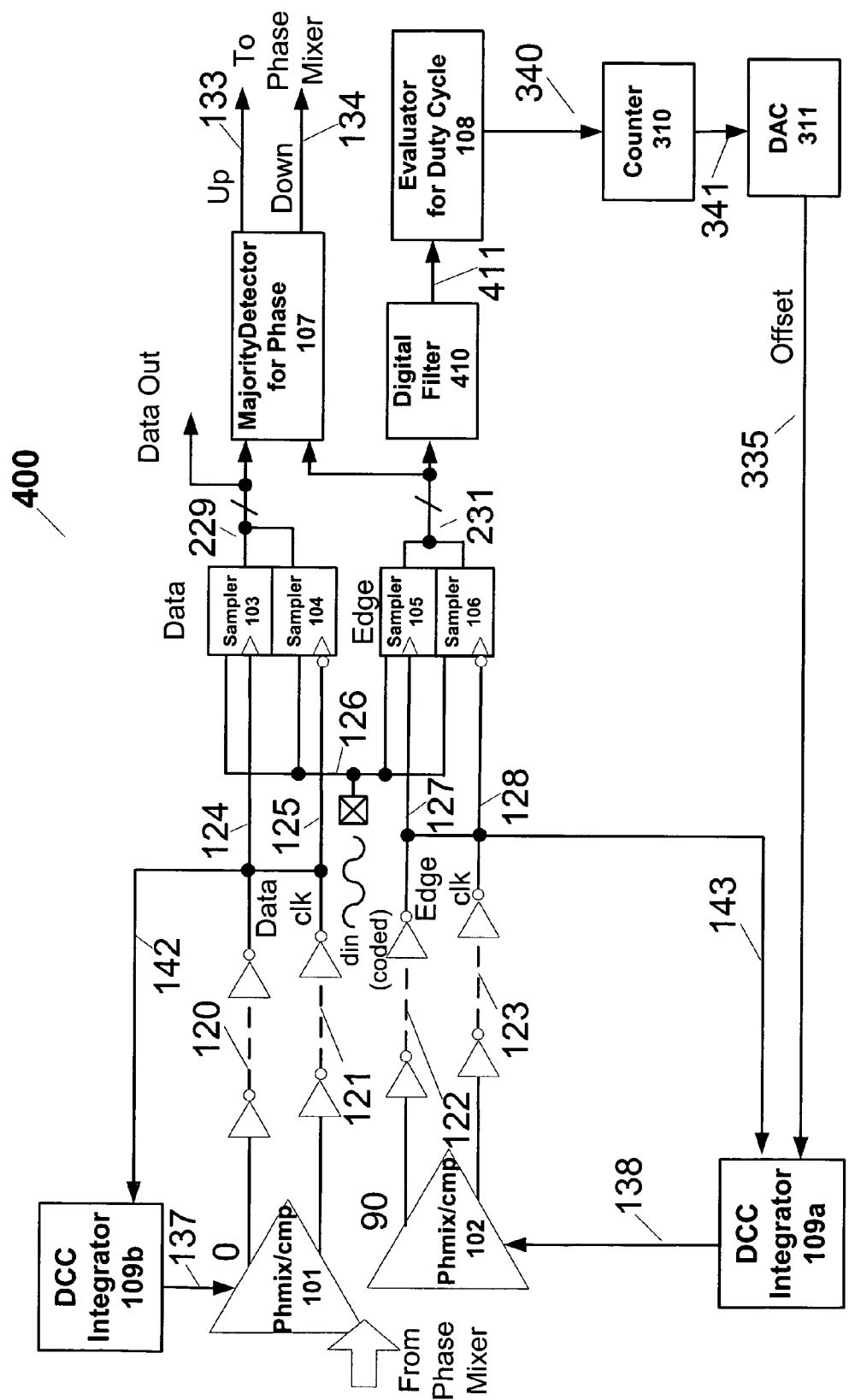
FIG. 5 is a block diagram illustrating using a digital filter and coding scheme in adjusting a duty-cycle of a clock signal in accordance with an embodiment of the present invention.

FIG. 5 illustrates an embodiment of the present invention that reduces the likelihood of misinterpreting a malevolent data signal in serial data din as being duty-cycle distortion. In particular, FIG. 5 shows a block diagram using an offset signal in adjusting a duty-cycle of a clock signal in receive circuit 400. FIG. 5 shows similar components seen in FIG. 4 except for the addition of digital filter 410 coupled to edge samplers 105-106 on line 231 and evaluator 108 on line 411. Edge samplers 105-106 output edge values to digital filter 410.

In order to reduce the likelihood that a malevolent data signal is misinterpreted as duty-cycle distortion, a coding scheme or digital filter is used in embodiments of the present invention. In using a coding scheme, transmit circuit 20 transmits identical or nearly identical even and odd data cell transitions in coded serial data din.

Alternatively in one embodiment, a digital filter 410 is used which allows edge values to pass to evaluator 108 only when there are an equal, or substantially equal, number of odd/even transitions and even/odd transitions that have accumulated. As ISI distortion will be present on all transitions, a difference in phase location of odd & even edges can then be correctly interpreted as a duty-cycle error. In alternate embodiments of the present invention, a digital filter 410 as described above is included in the embodiments illustrated in FIGS. 2-3 as well to eliminate the potential of a malevolent pattern.

In alternate embodiments illustrated by FIGS. 4 and 5 the offset output signal on line 335 is also provided as an input to the data clock DCC integrator 109b. The function of the offset input on the data clock DCC integrator 109b is not to alter the duty-cycle of the data clocks but rather to provide an input whereby the data clocks can be adjusted in phase to track the edge clocks and best remain in quadrature. This function is needed in an embodiment of the present invention in which the DCC integrator 109a and Phmix/cmp 102 alter the duty-cycle of edge clocks on lines 127/128 in such a way as will alter their quadrature phase relationship to the data clocks on lines 124/125. This can happen if Phmix/cmp 102 adds delay in the adjustment of duty-cycle.

Figure 7:
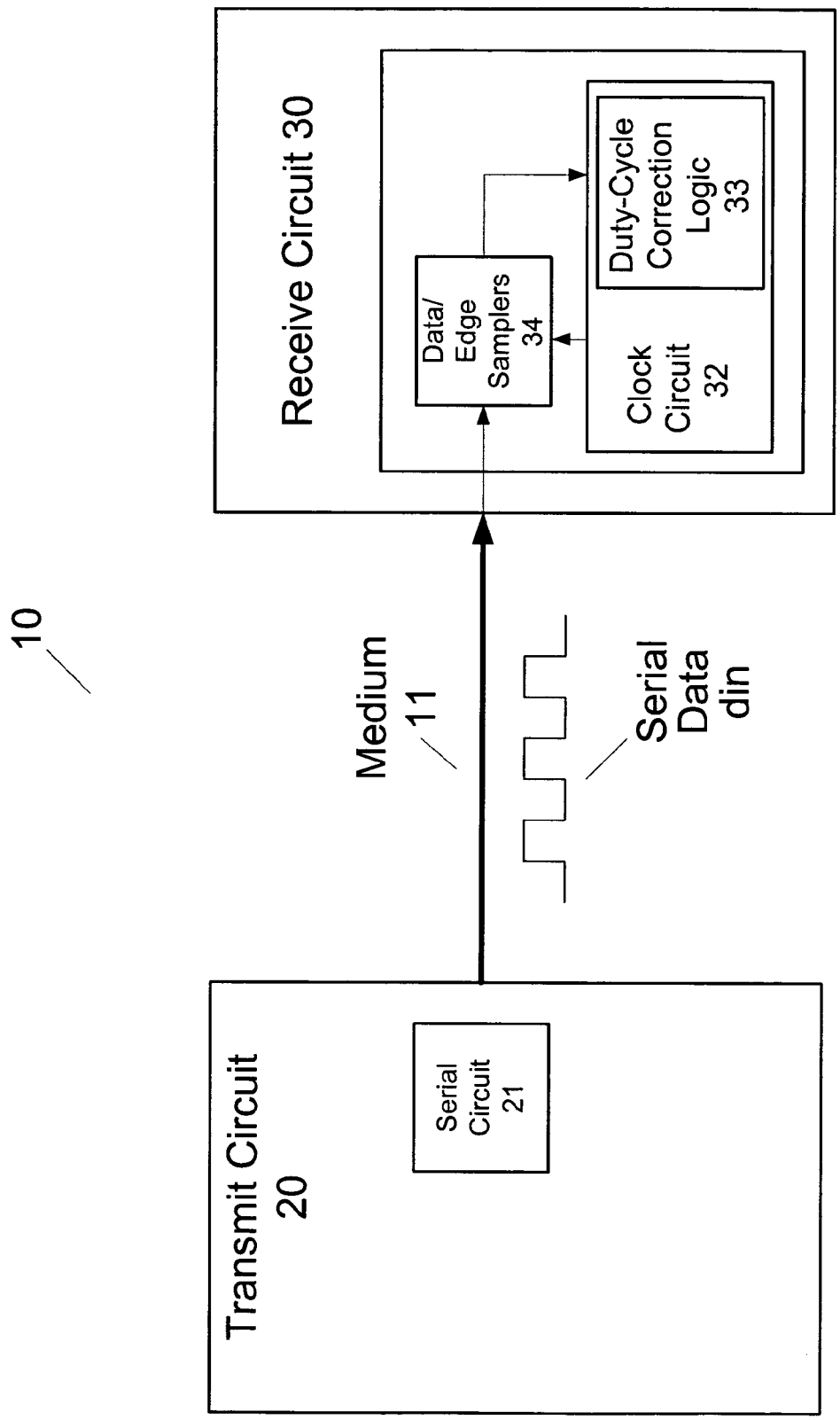
FIG. 7 is a block diagram illustrating a communication system in accordance with an embodiment of the present invention.

FIG. 7 illustrates a double-data rate communication system 10 according to an embodiment of the present invention. In particular, system 10 maximizes margins and reduces data error rates by adjusting a duty-cycle of a clock signal in receive circuit 30 responsive to a duty-cycle of incoming serial data din. In an embodiment of the present invention, serial data din is a double-data rate signal.

In an embodiment of the present invention, communication system 10 includes a transmit circuit 20 and a receive circuit 30 coupled by medium 11. In an embodiment of the present invention, transmit circuit 20, and in particular serial circuit 21, generates serial data din having a non 50% duty-cycle on medium 11 to receive circuit 30. In an embodiment of the present invention, transmit circuit 20 generates coded serial data din.

In an embodiment of the present invention, transmit circuit 20 is included in a memory controller and receive circuit 30 is included in a memory module.

In an embodiment of the present invention, reference clocks are used in receiver circuit 30 to facilitate clock recovery.

Receive circuit 30 actively looks for transitions in the incoming serial data din and phase aligns data clock dclk and edge clock eclk with respect to the incoming data din. Receive circuit 30 samples the serial data din by data/edge samplers 34. In an embodiment of the present invention, data/edge samplers 34 are shown as data samplers 103-104 and edge samplers 105-106 shown in FIGS. 2-5. In an embodiment of the present invention, the sampled serial data din is converted to parallel data. Clock circuit 32, includes duty-cycle-correction logic 33, that generates a clock signal for receive circuit 30 corresponding to the duty-cycle of serial data din. Duty-cycle-correction logic 33 is shown as evaluator circuit 108 coupled to data samplers 103-104 and edge sampler 106, as well as coupled to DCC integrator 109b as shown in FIG. 2. Other embodiments of duty-cycle-correction logic 33 are shown in FIGS. 2-5 and described above.

In an embodiment of the present invention, medium 11 is a wire or set of wires for transporting signals, such as waveforms. In an embodiment of the present invention, medium 11 is a bidirectional double-data rate data bus that may carry data information, control information or both. In an alternate embodiment of the present invention, medium 11 is a unidirectional bus. In an alternate embodiment of the present invention medium 11 is a unidirectional point-to-point transmission line.

Figure 8:
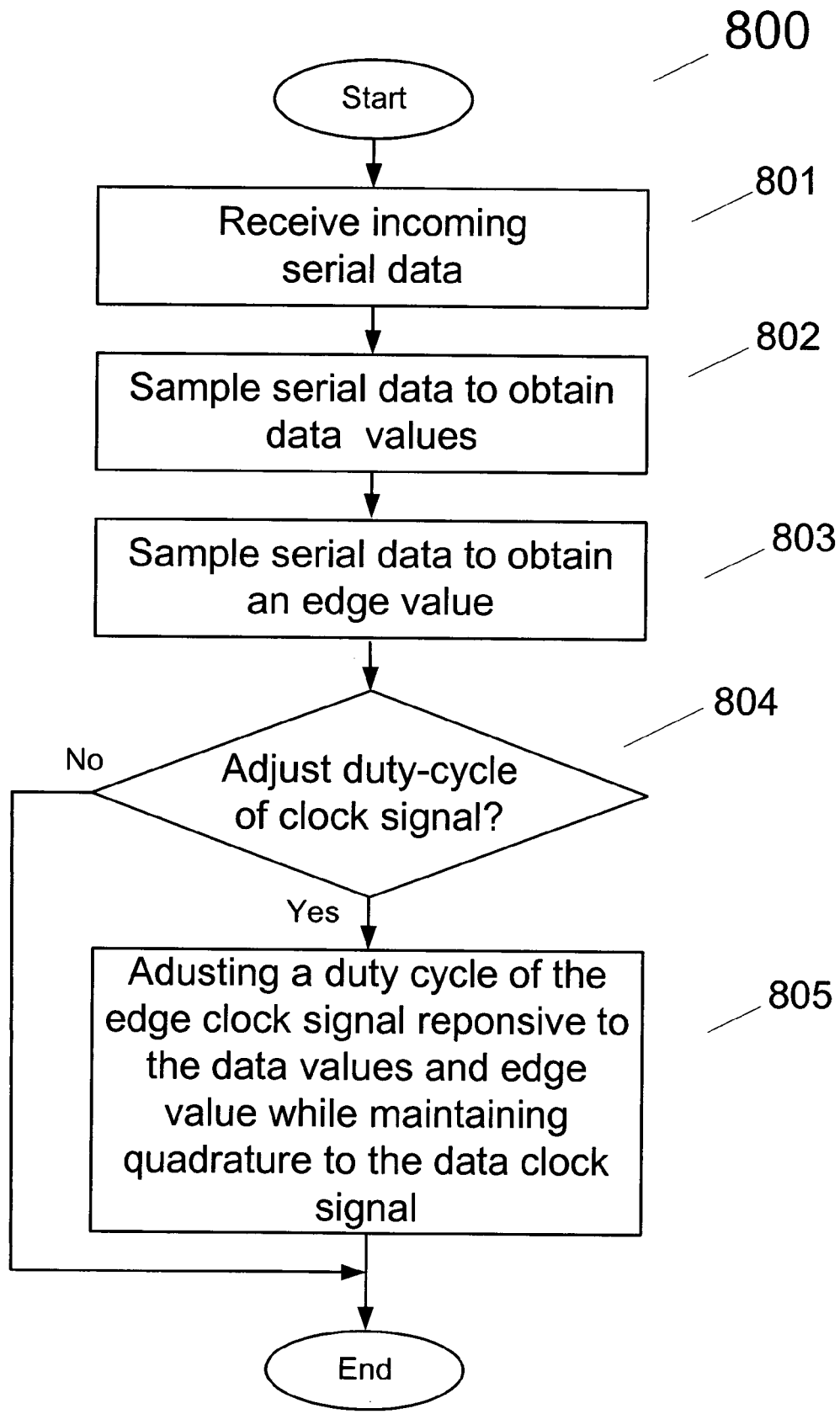
FIGS. 8-9 are flow charts of methods in accordance with embodiments of the present invention.
Figure 9:
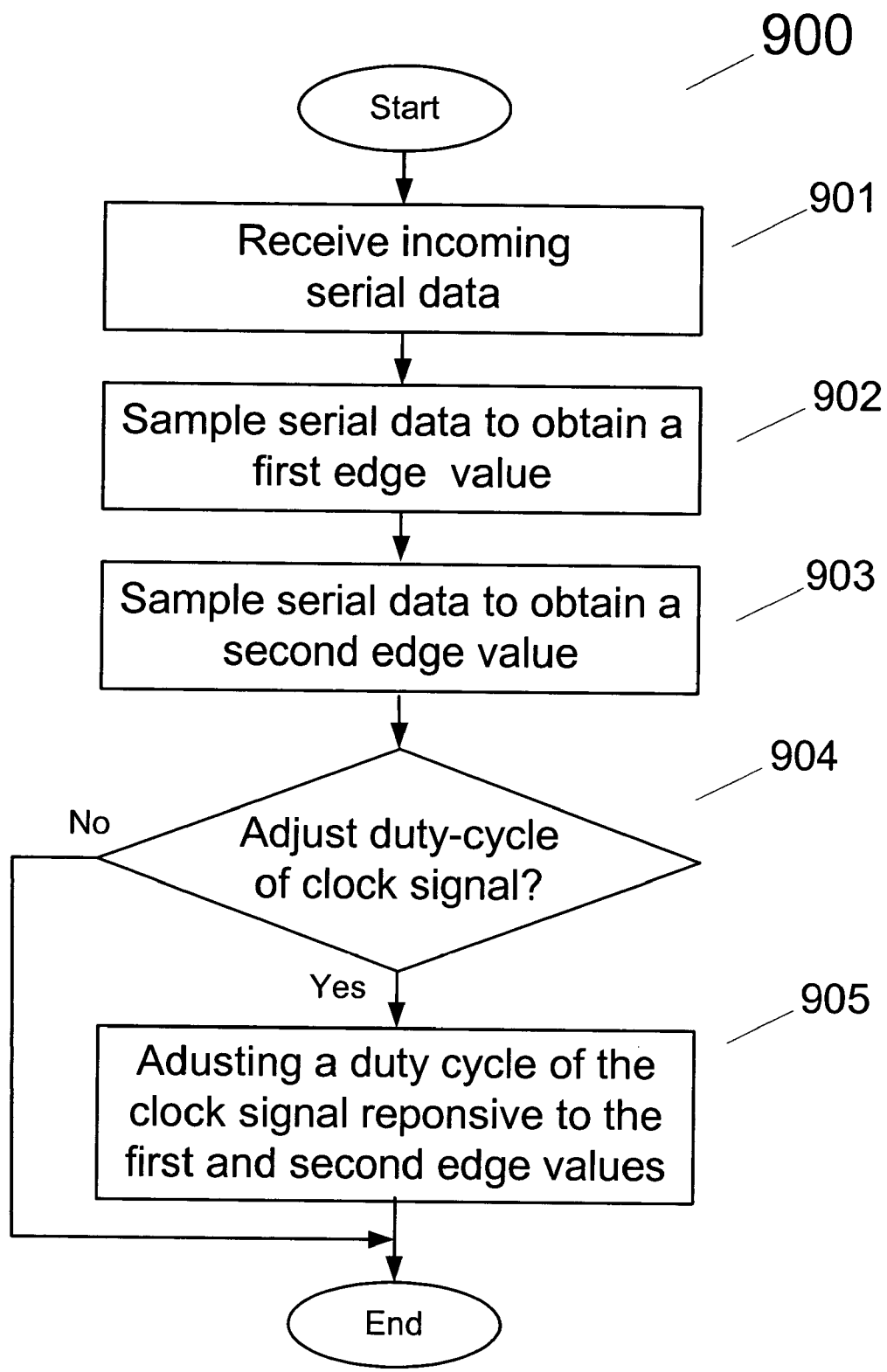

FIGS. 8-9 illustrate methods 800 and 900 according to embodiments of the present invention. In alternate embodiments of the present invention, steps illustrated in FIGS. 8-9 are carried out by hardware, software or a combination thereof. In alternate embodiments, the steps illustrated in FIGS. 8 and 9 are carried out by the components illustrated in FIGS. 2-5 and 7, respectively. As one of ordinary skill in the art would appreciate, other steps that are not shown may be included in various embodiments of the present invention.

Method 800 begins at step 801 where serial incoming data is received. Serial data is then sampled to obtain data values as illustrated by step 802. In an embodiment of the present invention, samplers 103 and 104 obtain data values in response to a data clock dclk as shown in FIG. 2. Serial data is sampled to obtain an edge value as illustrated by step 803. In an embodiment of the present invention, sampler 106 obtains an edge value in response to an edge clock eclk as shown in FIG. 2. A determination is made whether to adjust a duty-cycle of a clock signal as shown in step 804. If a clock signal duty-cycle needs to be adjusted, control transfers to step 805 where a edge clock signal duty-cycle is adjusted in response to the data values and edge value while maintaining quadrature to the data clock signal; otherwise, method 800 ends. In an embodiment of the present invention, an evaluator circuit 108, as illustrated in FIG. 2, outputs an up or down signal to adjust a clock signal duty-cycle.

Method 900, similar to method 800, begins at step 901 where serial incoming data is received. Serial data is sampled to obtain a first edge value and a second edge value as illustrated by steps 902 and 903, respectively. In an embodiment of the present invention, samplers 105 and 106 obtain a first edge value and a second edge value in response to an edge clock eclk as shown in FIG. 3. A determination is made whether to adjust a duty-cycle of a clock signal as shown in step 904. If a clock signal duty-cycle needs to be adjusted, control transfers to step 905 where a clock signal duty-cycle is adjusted; otherwise, method 900 ends. In an embodiment of the present invention, an evaluator circuit 108, as illustrated in FIG. 3, outputs an up or down signal to adjust a clock signal duty-cycle.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A circuit capable to receive an input signal having a duty-cycle, comprising:
   a first sampler capable to obtain a first edge value from the input signal responsive to an edge clock signal;
   a second sampler capable to obtain a first data value from the input signal responsive to a data clock signal; and,
   a duty-cycle-correction logic, coupled to the first and the second samplers, capable to generate a duty-cycle-correction signal that adjusts the edge clock signal to the duty-cycle of the input signal duty-cycle responsive to the first edge value and first data value.

2. The circuit of claim 1, wherein the data clock signal has an approximate 50% duty-cycle and is in quadrature with an adjusted edge clock signal.

3. The circuit of claim 1, further comprising:
   a third sampler, coupled to the duty-cycle-correction logic, capable to obtain a second data value; and,
   wherein the duty-cycle-correction logic is capable to generate the duty-cycle-correction signal responsive to the first data value, first edge value and second data value.

4. The circuit of claim 3, wherein the duty-cycle-correction logic comprises:
an evaluator circuit capable to generate at least one of an up signal and a down signal, responsive to the first data value, first edge value and second data value; and,
a duty-cycle clock integrator, coupled to the evaluator circuit, capable to generate the duty-cycle-correction signal responsive to the at least one of the up and down signal.

5. The circuit of claim 4, further comprising:
a first phase comparator, coupled to the first sampler, capable to generate the data clock signal; and,
a second phase comparator, coupled to the first duty-cycle clock integrator and the second sampler, capable to generate the edge clock signal responsive to the duty-cycle-correction signal.

6. The circuit of claim 1, wherein the input signal is a double-data rate signal and the circuit is included in a double-data rate system.

7. The circuit of claim 1, wherein the circuit is included in a memory module coupled to a double-data rate bus.

8. A circuit capable to receive an input signal having a duty-cycle, comprising:
a first sampler capable to obtain a first edge value from the input signal responsive to an edge clock signal;
a second sampler capable to obtain a second edge value from the input signal responsive to the edge clock signal; and
a duty-cycle-correction logic, coupled to the first and the second samplers, capable to generate a duty-cycle-correction signal that adjusts the edge clock signal to the duty-cycle of the input signal duty-cycle responsive to the first and second edge values.

9. The circuit of claim 8, wherein a data clock signal has an approximate 50% duty-cycle and is in quadrature with an adjusted edge clock signal.

10. The circuit of claim 8, wherein the duty-cycle-correction logic comprises:
an evaluator circuit capable to generate at least one of an up signal and a down signal, responsive to the first and second edge values; and,
a duty-cycle clock integrator, coupled to the evaluator circuit, capable to generate the duty-cycle-correction signal responsive to the at least one of the up and down signal.

11. The circuit of claim 10, further comprising:
a first phase comparator, coupled to the duty-cycle clock integrator and the first and second samplers, capable to generate the edge clock signal responsive to the duty-cycle-correction signal.

12. The circuit of claim 8, wherein the input signal is a double-data rate signal and the circuit is included in a double-data rate system.

13. The circuit of claim 8, wherein the circuit is included in a memory module coupled to a double-data rate bus.

14. A circuit capable to receive an input signal having a duty-cycle, comprising:
a first sampler capable to obtain a first edge value from the input signal responsive to an edge clock signal;
a second sampler capable to obtain a second edge value from the input signal responsive to the edge clock signal;
a duty-cycle-correction logic, coupled to the first and the second samplers, capable to generate a duty-cycle-correction signal that adjusts the edge clock to the duty-cycle of the input signal responsive to the first and second edge values;
wherein the duty-cycle-correction logic includes,
an evaluator circuit, coupled to the first and second samplers, capable to generate an adjust signal, responsive to the first and second edge values;
a counter, coupled to the evaluator circuit, capable to output a count value responsive to the adjust signal;
a digital-to-analog-converter, coupled to the counter, capable to generate an analog offset signal responsive to the count signal; and,
a duty-cycle clock integrator, coupled to the digital-to-analog-converter, capable to generate the duty-cycle-correction signal responsive to the analog offset signal.

15. The circuit of claim 14, wherein a data clock signal has an approximate 50% duty-cycle and is in quadrature with an adjusted edge clock signal.

16. The circuit of claim 14, further comprising;
a digital filter coupled to first and second samplers and the evaluator circuit.

17. The circuit of claim 16, wherein the input signal is a coded input signal having an approximate same number of even and odd data transitions.

18. The circuit of claim 14, further comprising:
a first phase comparator, coupled to the duty-cycle clock integrator and the first and second samplers, capable to generate the edge clock signal responsive to the duty-cycle-correction signal.

19. The circuit of claim 14, wherein the input signal is a double-data rate signal and the circuit is included in a double-data rate system.

20. The circuit of claim 14, wherein the circuit is included in a memory module coupled to a double-data rate bus.

21. An apparatus, comprising:
a transmit circuit capable to transmit a serial signal having a duty-cycle;
a receive circuit, coupled to the transmit circuit, including
a first sampler capable to obtain a first edge value from the serial signal responsive to an edge clock signal;
a second sampler capable to obtain a first data value from the serial signal responsive to a data clock signal; and,
a duty-cycle-correction logic, coupled to the first and the second samplers, capable to generate a duty-cycle-correction signal that adjusts the edge clock signal to the duty-cycle of the serial signal duty-cycle responsive to the first edge value and first data value.

22. An apparatus, comprising:
a transmit circuit capable to transmit a serial signal having a duty-cycle; and,
a receive circuit, coupled to the transmit circuit, including
a first sampler capable to obtain a first edge value from the serial signal responsive to an edge clock signal;
a second sampler capable to obtain a second edge value from the serial signal responsive to the edge clock signal; and,
a duty-cycle-correction logic, coupled to the first and the second samplers, capable to generate a duty-cycle-correction signal that adjusts the edge clock to the duty-cycle of the serial signal duty-cycle responsive to the first and second edge values.

23. An apparatus, comprising:
a transmit circuit capable to transmit a serial signal having a duty-cycle; and,
a receive circuit, coupled to the transmit circuit, including, a first sampler capable to obtain a first edge value from the serial signal responsive to an edge clock signal;

a second sampler capable to obtain a second edge value from the serial signal responsive to the edge clock signal;

a duty-cycle-correction logic, coupled to the first and the second samplers, capable to generate a duty-cycle-correction signal that adjusts the edge clock to the duty-cycle of the serial signal responsive to the first and second edge values;

wherein the duty-cycle-correction logic includes, an evaluator circuit, coupled to the first and second samplers, capable to generate an adjust signal, responsive to the first and second edge values;

a counter, coupled to the evaluator circuit, capable to output a count value responsive to the adjust signal; and, a digital-to-analog-converter, coupled to the counter, capable to generate the duty-cycle-correction signal responsive to the count signal.

24. A method, comprising the steps of:

receiving an input signal having a first duty-cycle;

sampling the input signal to obtain a plurality of edge values from the input signal responsive to an edge clock signal having a second duty-cycle; and, adjusting the second duty-cycle of the edge clock signals to the first duty-cycle of the input signal responsive to the plurality of edge values.

25. The method of claim 24, further comprising the steps of:

sampling the input signal to obtain a plurality of data values from the input signal responsive to a data clock signal.

26. The method of claim 25, wherein the adjusting step includes adjusting the data clock signal to have an approximate 50duty-cycle and be in quadrature with an adjusted edge clock signal.

27. A circuit capable to receive an input signal having a duty-cycle, comprising:

a sampler capable to obtain a plurality of edge values from the input signal responsive to an edge clock signal having a duty-cycle; and, means, coupled to the sampler, for adjusting the edge clock signal duty-cycle to the input signal duty-cycle.

* * * * *

UNITED STATES PATENT AND TRADEMARK OFFICE
CERTIFICATE OF CORRECTION

PATENT NO.        : 7,298,807 B2                                    Page 1 of 1
APPLICATION NO.   : 10/672853
DATED             : November 20, 2007
INVENTOR(S)       : Zerbe et al.

It is certified that error appears in the above-identified patent and that said Letters Patent is hereby corrected as shown below:

Col. 12, line 12:    after "approximate" and before "and"

Delete "50duty-cycle"

Insert --50% duty-cycle--

Signed and Sealed this

Twenty-seventh Day of May, 2008

JON W. DUDAS
*Director of the United States Patent and Trademark Office*